United States Patent
Li et al.

(10) Patent No.: US 9,653,283 B2
(45) Date of Patent: May 16, 2017

(54) METHOD OF MANUFACTURING A SEMICONDUCTOR DEVICE

(71) Applicant: Semiconductor Manufacturing International (Shanghai) Corporation, Shanghai (CN)

(72) Inventors: Fenglian Li, Shanghai (CN); Jinghua Ni, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/610,581

(22) Filed: Jan. 30, 2015

(65) Prior Publication Data

US 2015/0243523 A1 Aug. 27, 2015

(30) Foreign Application Priority Data

Feb. 21, 2014 (CN) .......................... 2014 1 0061224

(51) Int. Cl.
| | | |
|---|---|---|
| *H01L 21/8238* | (2006.01) | |
| *H01L 21/3205* | (2006.01) | |
| *H01L 21/4763* | (2006.01) | |
| *H01L 21/70* | (2006.01) | |
| *H01L 21/02* | (2006.01) | |
| *H01L 29/66* | (2006.01) | |

(52) U.S. Cl.
CPC .. *H01L 21/02057* (2013.01); *H01L 21/02071* (2013.01); *H01L 21/823842* (2013.01); *H01L 29/66545* (2013.01)

(58) Field of Classification Search
CPC ......... H01L 29/66545; H01L 21/31116; H01L 21/31118; H01L 21/32137; H01L 21/02057; H01L 21/823842; H01L 21/02071
USPC .......... 257/369, E21.252, E21.444; 438/199, 438/585
See application file for complete search history.

(56) References Cited

U.S. PATENT DOCUMENTS

| | | | |
|---|---|---|---|
| 8,058,119 B2 | 11/2011 | Chung et al. | |
| 2010/0237424 A1* | 9/2010 | Cheng ............. | H01L 21/823828 257/369 |
| 2011/0156166 A1* | 6/2011 | Huang ............. | H01L 21/28247 257/392 |
| 2012/0322218 A1* | 12/2012 | Lai .................. | H01L 21/823842 438/303 |

(Continued)

OTHER PUBLICATIONS

Thedjoisworo et al., Comparison of the effects of downstream H2- and O2-based plasmas on the removal of photoresist, silicon, and silicon nitride, Journal of Vacuum Science & Technology B 31(2), Mar./Apr. 2013, pp. 021206-1 to 021206-9.

*Primary Examiner* — Fernando L Toledo
*Assistant Examiner* — Aaron Gray
(74) *Attorney, Agent, or Firm* — Innovation Counsel LLP (57) ABSTRACT

A method of manufacturing a semiconductor device is provided. The method includes providing a semiconductor substrate including a transistor and a dummy gate disposed on the transistor, removing the dummy gate on the transistor, performing treatment using hydrogen ($H_2$) on a surface of the semiconductor substrate, so as to remove residue materials left behind from the removal of the dummy gate, and forming a metal gate on the transistor.

19 Claims, 6 Drawing Sheets

(56) References Cited

U.S. PATENT DOCUMENTS

2014/0030863 A1\* 1/2014 Lugani .................... H01L 28/40
 438/381
2014/0315365 A1\* 10/2014 Chen ................. H01L 21/32134
 438/299

\* cited by examiner

METHOD OF MANUFACTURING A SEMICONDUCTOR DEVICE

CROSS-REFERENCE TO RELATED APPLICATION

This application claims priority to Chinese Patent Application No. 201410061224.3 filed on Feb. 21, 2014, the disclosure of which is incorporated herein by reference in its entirety.

BACKGROUND

Technical Field

The present disclosure relates to the field of semiconductor technology, and more particularly to a method of manufacturing a semiconductor device.

Description of the Related Art

In the field of semiconductor technology, as the critical dimension (CD) of devices continues to shrink, high-k dielectric layers and metal gates are being used to replace the silicon oxynitride (SiON) and polysilicon in conventional semiconductor laminate structures. The use of high-k dielectric layers and metal gates can resolve issues arising from thin gate oxide, for example, gate leakage, polysilicon depletion, boron diffusion, etc.

In the prior art, to adjust the work function of the p-type metal-oxide-semiconductor (PMOS) and n-type metal-oxide-semiconductor (N MOS), metals having different work functions are usually deposited on the PMOS and the NMOS regions. The aforementioned process includes removing the polysilicon gate (dummy gate) in the respective PMOS and NMOS regions prior to depositing the metals having the different work functions. However, the removal of the polysilicon gate (dummy gate) often creates irregularities in the surface morphology at the interface/boundary between the PMOS and NMOS, and leaves behind photoresist residue and polysilicon residue, among other issues. The irregularities and residue can severely impact the yield of the semiconductor device.

Figure 1A:
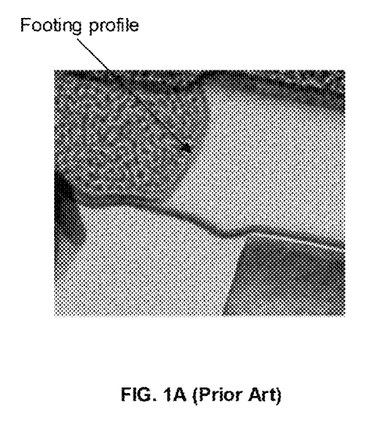
FIGS. 1A, 1B, 1C, and 1D illustrate scanning electron microscope (SEM) images of a semiconductor device manufactured using a prior art method.
Figure 1B:
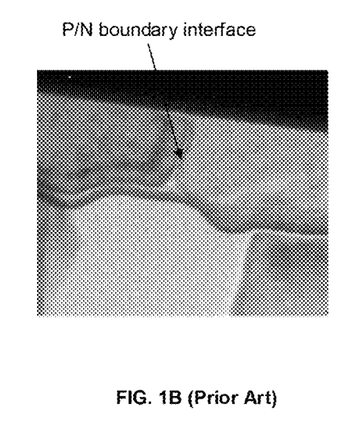
Figure 1C:
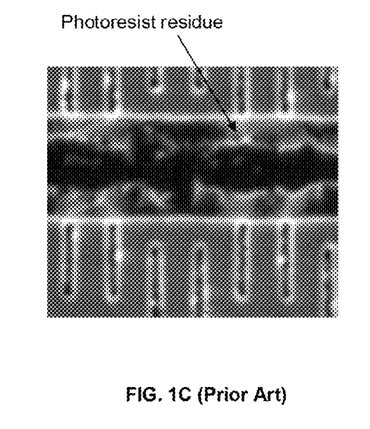
Figure 1D:
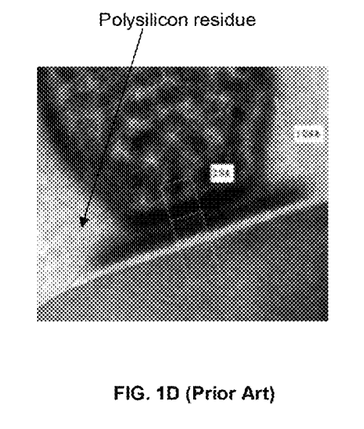

FIGS. 1A through 1D illustrate scanning electron microscope (SEM) images of a semiconductor device manufactured using a prior art method. Specifically, the SEM images illustrate different defects in the resulting structures after the removal of the polysilicon dummy gate from the PMOS and NMOS regions. For example, FIG. 1A shows the footing profile of a polysilicon dummy gate after a portion of the polysilicon dummy gate has been removed from one of the PMOS and NMOS regions. FIG. 1B shows irregularities in the surface morphology at the interface/boundary between the PMOS and NMOS (P/N boundary interface). FIGS. 1C and 1D illustrate the presence of photoresist residue and polysilicon residue, respectively. As previously mentioned, the above defects can severely impact the yield of the semiconductor device.

SUMMARY

The present disclosure addresses at least the above issues in the prior art.

According to an embodiment of the inventive concept, a method of manufacturing a semiconductor device is provided. The method includes providing a semiconductor substrate including a transistor and a dummy gate disposed on the transistor, removing the dummy gate on the transistor, performing treatment using hydrogen (H$_2$) on a surface of the semiconductor substrate, so as to remove residue materials left behind from the removal of the dummy gate, and forming a metal gate on the transistor.

In one embodiment, the transistor may be one of an n-type transistor and a p-type transistor.

According to another embodiment of the inventive concept, a method of manufacturing a semiconductor device is provided. The method includes: providing a semiconductor substrate including a first transistor, a second transistor, and a dummy gate disposed on the first transistor and the second transistor; removing a first portion of the dummy gate above the first transistor; performing treatment using hydrogen (H$_2$) on a surface of the semiconductor substrate, so as to remove residue materials left behind from the removal of the first portion of the dummy gate above the first transistor; forming a first metal gate on the first transistor; removing a second portion of the dummy gate above the second transistor; performing the treatment using the hydrogen (H$_2$) on the surface of the semiconductor substrate, so as to remove residue materials left behind from the removal of the second portion of the dummy gate above the second transistor; and forming a second metal gate on the second transistor.

In one embodiment, the first transistor and the second transistor may have opposite polarities.

In one embodiment, the first transistor may be one of an n-type transistor and a p-type transistor, and the second transistor may be the other one of the n-type transistor and the p-type transistor.

In one embodiment, a flow rate of the hydrogen (H$_2$) may range from about 50 sccm to about 500 sccm.

In one embodiment, the treatment may be performed using a gas mixture comprising the hydrogen (H$_2$) and a second gas.

In one embodiment, the second gas may be an inert gas including argon (Ar) or helium (He).

In one embodiment, the treatment may be performed in a dry etching apparatus.

In one embodiment, a source power of the dry etching apparatus may be controlled between about 200 W to about 2000 W during the treatment.

In one embodiment, a bias voltage of the dry etching apparatus may be controlled between about 0 V to about 100 V during the treatment.

In one embodiment, the residue materials may include at least one of dummy gate residue, photoresist residue, and polymer residue.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

Figure 2A:
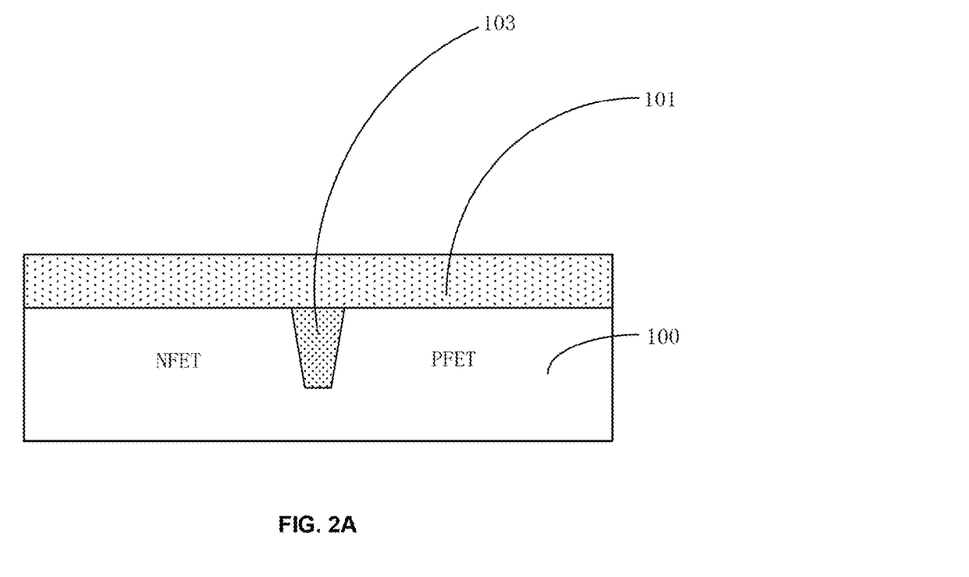
FIGS. 2A, 2B, 2C, 2D, 2E, and 2F depict schematic cross-sectional views of a semiconductor device at different stages of manufacture according to an embodiment.

First, a method of manufacturing a semiconductor device according to an embodiment will be described in detail with reference to FIGS. 2A though 2F. Specifically, FIGS. 2A though 2F depict schematic cross-sectional views of the semiconductor device at different stages of manufacture. The method includes the following steps.

In Step A1, a semiconductor substrate 100 is provided. An n-type field effect transistor (NFET) and a p-type field effect transistor (PFET) are disposed in the semiconductor substrate 100. The NFET and the PFET are spaced apart from each other with a trench 103 disposed therebetween. A dummy gate 101 is disposed on the semiconductor substrate 100 above the NFET and PFET, as illustrated in FIG. 2A. In some embodiments (not shown), other components (such an interlayer dielectric layer (ILD), dummy gate sidewalls, etc.) may be formed on the semiconductor substrate 100.

In some embodiments (not shown), the semiconductor substrate 100 may include an ILD layer (e.g. an ILD 'zeroth' layer (ILD-0)) that has already undergone chemical mechanical processing (CMP).

Figure 2B:
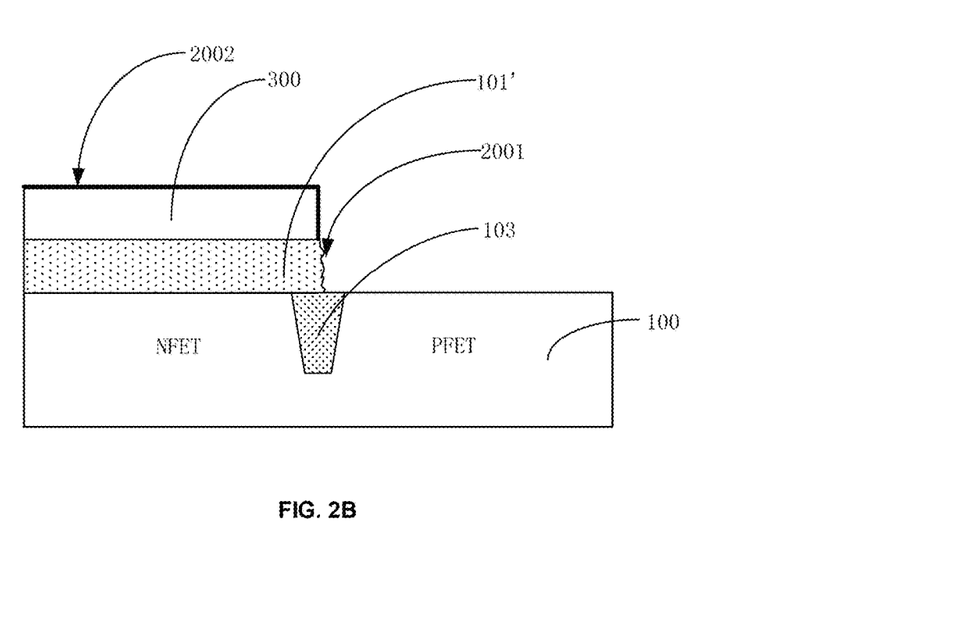

In Step A2, a photoresist 300 is formed covering the NFET. The photoresist 300 is patterned and serves as an etch mask for etching the portion of the dummy gate 101 above the PFET, as illustrated in FIG. 2B. The remaining portion of the dummy gate 101 above the NFET (after the etching) is denoted by 101'.

After the portion of the dummy gate 101 above the PFET has been removed, irregularities 2001 in the surface morphology may be formed at an interface/boundary between the PFET and NFET. As shown in FIG. 2B, the irregularities 2001 may be formed at an edge surface of the dummy gate 101' above the trench 103. In addition, polymer residue 2002 may be formed on the photoresist 300 during the removal of the portion of the dummy gate 101 above the PFET. As shown in FIG. 2B, the polymer residue 2002 is formed covering top and side surfaces of the photoresist 300.

In Step A3, the photoresist 300 is removed. The surface of the semiconductor substrate 100 then undergoes treatment using hydrogen (H$_2$), so as to remove any dummy gate residue and photoresist residue above the PFET. The resulting structure after Step A3 is shown in FIG. 2C.

Figure 2C:
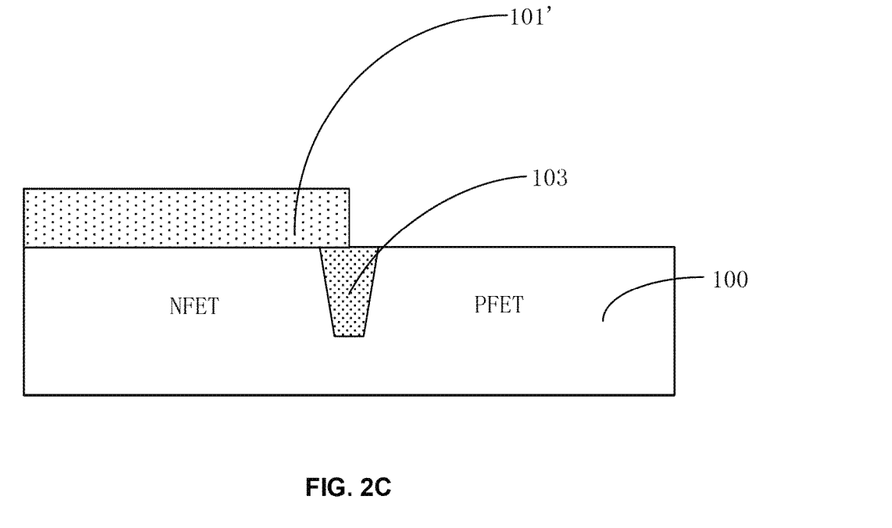

As shown FIG. 2C, after the hydrogen (H$_2$) treatment, the irregularities 2001 in the surface morphology at the interface/boundary between the PFET and NFET are removed. In addition, the polymer residue 2002 is removed, as well as any dummy gate residue remaining in the PFET region. In particular, the hydrogen (H$_2$) surface treatment has the following benefits: (1) H$_2$ can remove dummy gate residue (typically made of polysilicon) without damaging a high-k cap layer (not shown, typically made of TiN); (2) H$_2$ can remove polymer residue previously produced during dry etching; and (3) H$_2$ can remove any remaining photoresist residue (through ashing).

Accordingly, the hydrogen (H$_2$) treatment can be used to alter the surface morphology of the polysilicon (e.g. dummy gate 101') at the interface/boundary between the PFET and the NFET. The H$_2$ treatment can also remove any remaining photoresist residue. In addition, the H$_2$ treatment can remove polysilicon residue (dummy gate residue) remaining on the trench between the PFET and the NFET. Accordingly, by adding the H$_2$ treatment after the removal of the dummy gate, the yield and performance of the resulting semiconductor device can be improved.

The efficiency of the residue removal can be improved by adjusting the flow rate of the H$_2$. In some embodiments, the flow rate of the H$_2$ ranges from about 50 sccm to about 500 sccm.

In some embodiments, the surface treatment may include treating the surface of the semiconductor substrate 100 using more than one gas. For example, the H$_2$ may be mixed with Ar, He, or some other inert gas, so as to improve residue removal capability. However, the H$_2$ is typically not mixed with N$_2$, since adding N$_2$ could reduce the residue removal capability of the H$_2$.

In some embodiments, Step A3 may be performed using a dry etching apparatus (not shown). The dry etching apparatus may include, for example, an inductively coupled plasma (ICP) etching tool. During the surface treatment of the semiconductor substrate 100, the source power of the dry etching apparatus may be controlled between about 200 W to about 2000 W, and the bias voltage controlled between about 0 V to about 100 V.

Figure 2D:
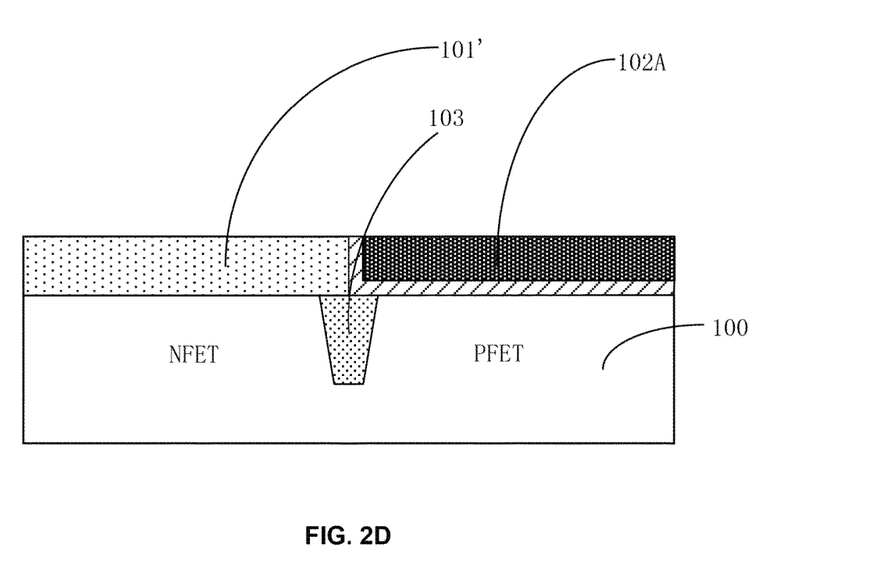

In Step A4, a metal gate 102A is formed on the PFET, as shown in FIG. 2D. The metal gate 102A may be formed by depositing a metal layer over the PFET region and performing CMP on the metal layer.

Figure 2E:
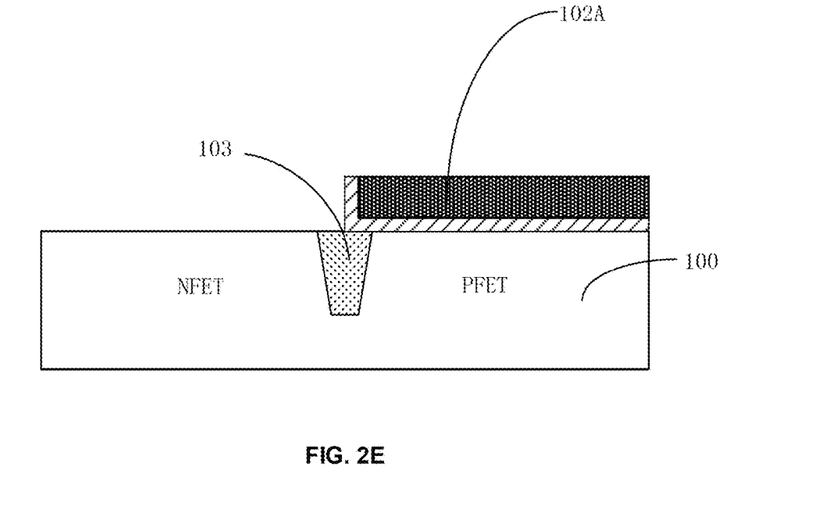

In Step A5, the dummy gate 101' on the NFET is removed, and H$_2$ treatment is performed on the surface of the semiconductor substrate 100, so as to remove the dummy gate residue and photoresist residue in the NFET region. The resulting structure after Step A5 is shown in FIG. 2E. Since the H$_2$ treatment in Step A5 is similar to the H$_2$ treatment in Step A3, a repeated description shall be omitted.

Figure 2F:
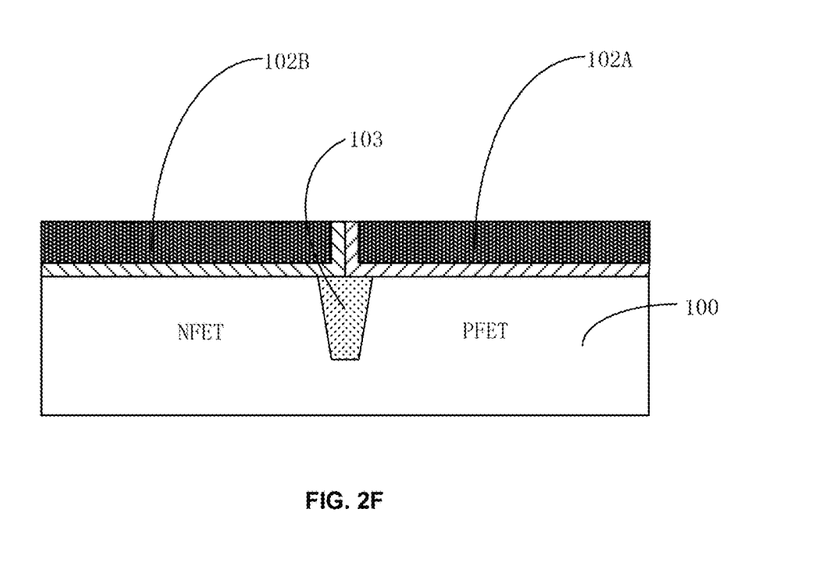

In Step A6, a metal gate 102B is formed on the NFET, as shown in FIG. 2F. The metal gate 102B may be formed by depositing a metal layer over the NFET region and performing CMP on the metal layer.

In the above embodiment, the metal gate 102A and the metal gate 102B are formed of metals having different work functions.

A method of manufacturing a semiconductor device according to an embodiment has been described above with reference to Steps A1 through A6. However, the inventive concept is not limited to the above and may include additional semiconductor processing steps known to those skilled in the art. For example, in one embodiment, additional steps may be added after Step A6. The additional steps may include forming dielectric layers and interconnects. Since the additional steps are known to those skilled in the art, a detailed description of those steps will be omitted.

According to the above method of manufacturing the semiconductor device, by adding the H$_2$ surface treatment after the removal of the dummy gate, the surface morphology of the polysilicon (dummy gate) at the interface/boundary between the PFET and the NFET can be altered. Also, the H$_2$ treatment can remove any remaining photoresist residue and polysilicon residue. Accordingly, the yield and performance of the semiconductor device can be improved using the above exemplary method.

In Steps A1 through A6, the portion of the dummy gate above the PFET is removed before removing the portion of the dummy gate above the NFET. However, the inventive concept is not limited thereto. In other embodiments, the portion of the dummy gate in the NFET is removed before removing the portion of the dummy gate in the PFET. In some alternative embodiments, the method may be used to form a semiconductor device consisting of either an NFET or a PFET. In some further embodiments, the method may be used to form a fin-type field effect transistor (Fin FET).

Figure 3:
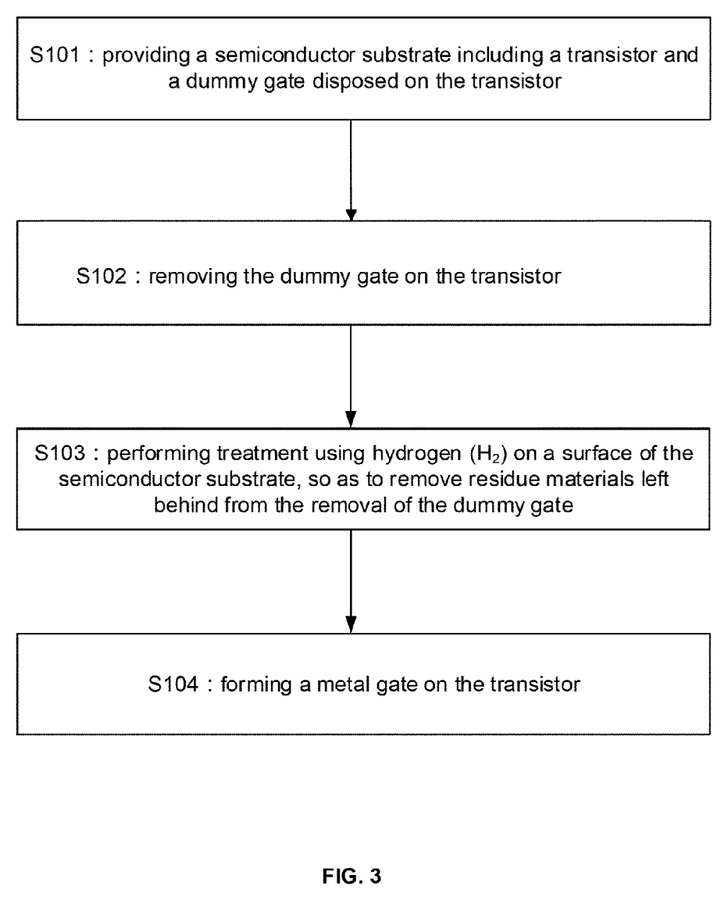
FIG. 3 is a flowchart illustrating a method of manufacturing a semiconductor device according to an embodiment.

FIG. 3 is a flowchart of a method for manufacturing a semiconductor device according to an embodiment. The method of FIG. 3 includes the following steps.

Step S101: providing a semiconductor substrate including a transistor and a dummy gate disposed on the transistor. The transistor may be either an n-type transistor or a p-type transistor.

Step S102: removing the dummy gate on the transistor.

Step S103: performing treatment using hydrogen (H$_2$) on a surface of the semiconductor substrate, so as to remove residue materials left behind from the removal of the dummy gate.

Step S104: forming a metal gate on the transistor.

Figure 4:
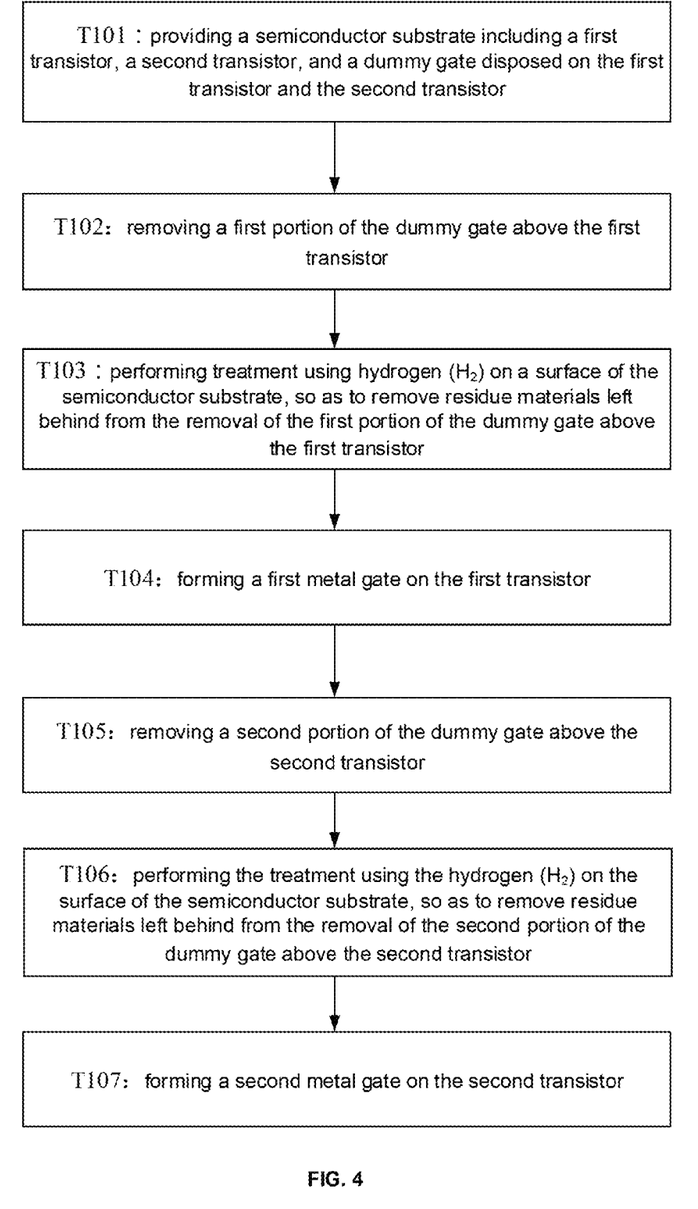
FIG. 4 is a flowchart illustrating a method of manufacturing a semiconductor device according to another embodiment.

FIG. 4 is a flowchart of a method for manufacturing a semiconductor device according to another embodiment. The method of FIG. 4 is similar to the method described earlier with reference to the schematic cross-sectional views of FIGS. 2A through 2F. The method of FIG. 4 includes the following steps.

Step T101: providing a semiconductor substrate including a first transistor, a second transistor, and a dummy gate disposed on the first transistor and the second transistor. The first transistor and the second transistor have opposite polarities. For example, if the first transistor is an n-type transistor, the second transistor is then a p-type transistor. Alternatively, if the first transistor is a p-type transistor, the second transistor is then an n-type transistor.

Step T102: removing a first portion of the dummy gate above the first transistor.

Step T103: performing treatment using hydrogen (H$_2$) on a surface of the semiconductor substrate, so as to remove residue materials left behind from the removal of the first portion of the dummy gate above the first transistor.

Step T104: forming a first metal gate on the first transistor.

Step T105: removing a second portion of the dummy gate above the second transistor.

Step T106: performing the treatment using the hydrogen (H$_2$) on the surface of the semiconductor substrate, so as to remove residue materials left behind from the removal of the second portion of the dummy gate above the second transistor.

Step T107: forming a second metal gate on the second transistor.

The "residue materials" in Steps S103, T103, and T106 refer to dummy gate residue, photoresist residue, polymer residue, and/or other types of residue left behind from the processing.

Embodiments of a method of manufacturing a semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a semiconductor device, comprising:
   providing a semiconductor substrate including a first transistor, a second transistor, a trench disposed between the first transistor and the second transistor, and a dummy gate disposed on the first transistor, the second transistor, and the trench;
   selectively forming a photoresist on a first portion of the dummy gate over the first transistor and exposing a second portion of the dummy gate over the second transistor;
   removing the second portion of the dummy gate on the second transistor using the photoresist, so that an edge surface of the dummy gate between the first transistor and the second transistor above the trench is exposed while the dummy gate remains over more than half of the first transistor;
   performing a treatment using hydrogen ($H_2$) on a surface of the semiconductor substrate and the edge surface of the dummy gate, so as to remove residue materials left behind from the removal of the dummy gate; and
   forming a metal gate on the second transistor.

2. The method according to claim 1, wherein the first transistor is one of an n-type transistor and a p-type transistor, and the second transistor is the other one of the n-type transistor and the p-type transistor.

3. The method according to claim 1, wherein a flow rate of the hydrogen ($H_2$) ranges from about 50 sccm to about 500sccm.

4. The method according to claim 1, wherein the treatment is performed using a gas mixture comprising hydrogen ($H_2$) and a second gas.

5. The method according to claim 4, wherein the second gas is an inert gas including argon (Ar) or helium (He).

6. The method according to claim 1, wherein the treatment is performed in a dry etching apparatus.

7. The method according to claim 6, wherein a source power of the dry etching apparatus is controlled between about 200 W to about 2000 W during the treatment.

8. The method according to claim 6, wherein a bias voltage of the dry etching apparatus is controlled between about 0 V to about 100 V during the treatment.

9. The method according to claim 1, wherein the residue materials include at least one of dummy gate residue, photoresist residue, and polymer residue.

10. A method of manufacturing a semiconductor device, comprising:
    providing a semiconductor substrate including a first transistor, a second transistor, and a dummy gate disposed on the first transistor and the second transistor;
    removing a first portion of the dummy gate above the first transistor, while the dummy gate remains over more than half of the second transistor;
    performing a treatment using hydrogen ($H_2$) on a surface of the semiconductor substrate and an edge surface of the dummy gate that is exposed between the first transistor and the second transistor over a trench, so as to remove residue materials left behind from the removal of the first portion of the dummy gate above the first transistor;
    forming a first metal gate on the first transistor;
    removing a second portion of the dummy gate above the second transistor;
    performing the treatment using hydrogen ($H_2$) on the surface of the semiconductor substrate, so as to remove residue materials left behind from the removal of the second portion of the dummy gate above the second transistor; and
    forming a second metal gate on the second transistor.

11. The method according to claim 10, wherein the first transistor and the second transistor have opposite polarities.

12. The method according to claim 11, wherein the first transistor is one of an n-type transistor and a p-type transistor, and the second transistor is the other one of the n-type transistor and the p-type transistor.

13. The method according to claim 10, wherein a flow rate of the hydrogen ($H_2$) ranges from about 50 sccm to about 500sccm.

14. The method according to claim 10, wherein the treatment is performed using a gas mixture comprising hydrogen ($H_2$) and a second gas.

15. The method according to claim 14, wherein the second gas is an inert gas including argon (Ar) or helium (He).

16. The method according to claim 10, wherein the treatment is performed in a dry etching apparatus.

17. The method according to claim 16, wherein a source power of the dry etching apparatus is controlled between about 200 W to about 2000 W during the treatment.

18. The method according to claim 16, wherein a bias voltage of the dry etching apparatus is controlled between about 0 V to about 100 V during the treatment.

19. The method according to claim 10, wherein the residue materials include at least one of dummy gate residue, photoresist residue, and polymer residue.

* * * * *